June 20, 1961 R. C. CARLSON 2,989,629

TUNING SHAFT ARRANGEMENT FOR TELEVISION TUNER

Filed June 21, 1957 2 Sheets-Sheet 1

INVENTOR.
REUBEN C. CARLSON
BY
J. D. Douglas
HIS ATTORNEY

June 20, 1961 R. C. CARLSON 2,989,629

TUNING SHAFT ARRANGEMENT FOR TELEVISION TUNER

Filed June 21, 1957 2 Sheets-Sheet 2

INVENTOR.
REUBEN C. CARLSON

BY J. D. Douglas

HIS ATTORNEY

United States Patent Office 2,989,629
Patented June 20, 1961

2,989,629

TUNING SHAFT ARRANGEMENT FOR TELEVISION TUNER

Reuben C. Carlson, River Grove, Ill., assignor to Admiral Corporation, Chicago, Ill., a corporation of Delaware Filed June 21, 1957, Ser. No. 667,213
7 Claims. (Cl. 250—40)

This invention relates generally to a tuner for a television receiver and is directed particularly to a tuning shaft arrangement for such a tuner.

It is common practice to provide in television receivers a tuner operated by a main tuning shaft which may be turned to tune in the desired channel. The tuner includes an R.F. oscillator which is heterodyned against the incoming signal to produce an I.F. signal which is fed into the following stage in the receiver. Commonly, there also is provided a fine tuning shaft which is mounted in coaxial rotatable relationship with respect to the main tuning shaft. The fine tuning shaft operates a trimmer condenser so that by turning the fine tuning shaft the fine tuning adjustment may be accomplished following the selection of the desired channel by means of the main tuning shaft.

With tuners of this general type, difficulty has been encountered due to radiation from the portion of the main tuning shaft between its control knob and the chassis which supports the tuner components. The main tuning shaft tends to pick up R.F. signals from the R.F. oscillator and because its outer end is ungrounded it acts as an antenna, radiating such signals.

The present invention is directed to a tuning shaft arrangement for a television tuner which avoids this difficulty.

Accordingly, it is an object of this invention to provide a novel tuning shaft arrangement for a television tuner which prevents undesired radiation from the tuning shaft.

Other objects and advantages of the present invention will be apparent from the following description of a preferred embodiment thereof, which is illustrated in the accompanying drawings.

Figures 1, 3:
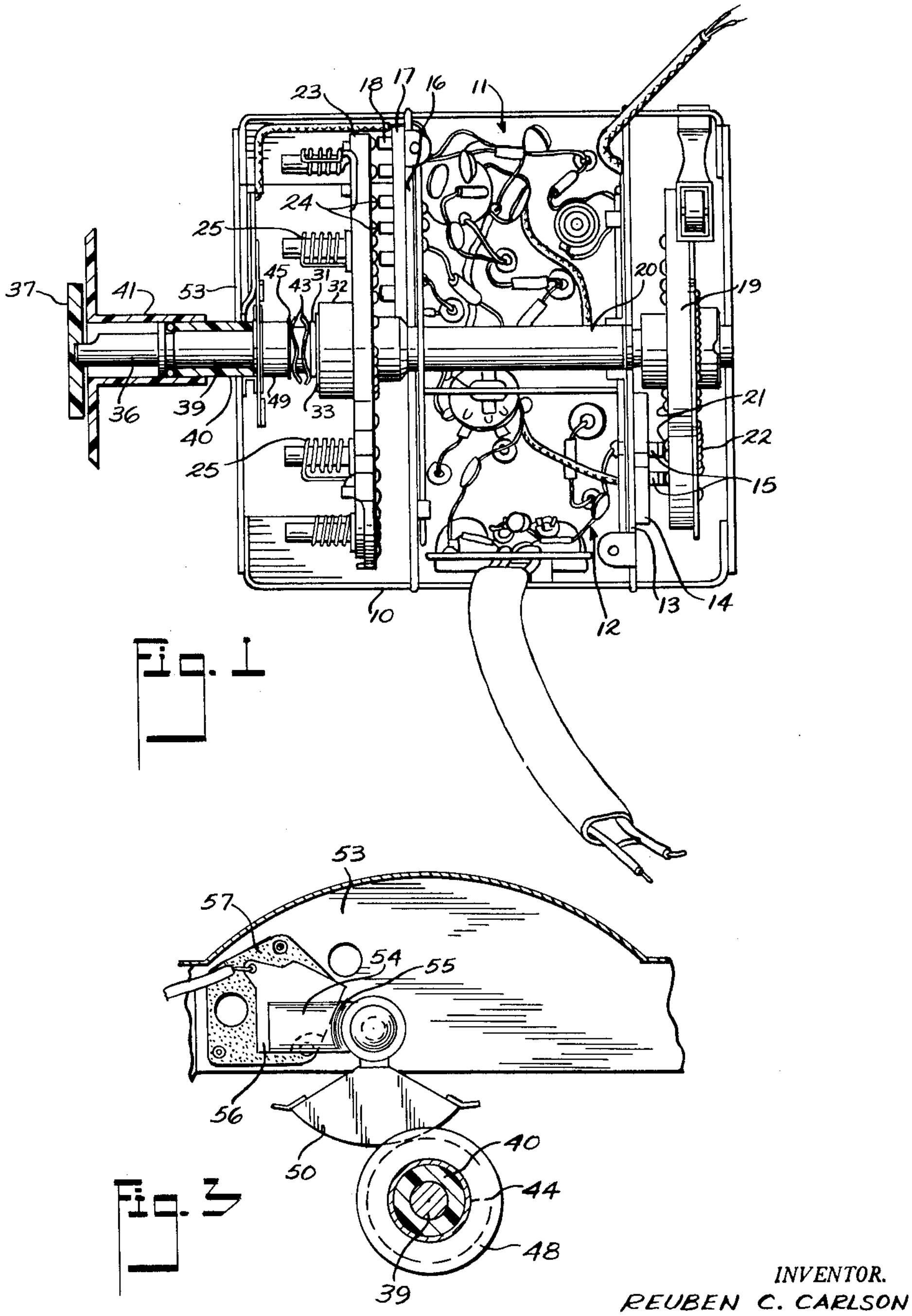
FIG. 1 is a plan view, with parts broken away for clarity, showing the tuner.
FIG. 3 is a vertical section taken along the line 3—3 in FIG. 2 and showing the trimmer condenser operated by the fine tuning shaft.

Referring first to FIG. 1, the tuner includes a grounded metal chassis 10 on which are positioned the R.F. amplifier components 12 and the R.F. oscillator and mixer components 11. A first transverse wall 13 of the chassis carries an insulation support 14 on which are positioned a plurality of switch contacts 15 connected to the R.F. amplifier components. Another transverse wall 16 of the chassis similarly carries an insulation support 17 on which are positioned a plurality of switch contacts 18 connected to the oscillator and mixer components.

A first insulation disc 19 mounted on the main tuning shaft which is indicated generally by the reference numeral 20, carries a plurality of contacts 21 for engagement selectively with the R.F. amplifier contacts 15. Disc 19 also supports inductances 22 which are connected to the contacts 21, so as to be switched into the R.F. amplifier circuit selectively depending upon the position to which the main tuning shaft is turned.

A second disc 23 on the main tuning shaft 20 carries a plurality of contacts 24 for engagement selectively with the oscillator and mixer contacts 18. Disc 23 carries a plurality of inductances 25 connected to these contacts 24 so as to be switched into the oscillator and mixer circuits selectively. Preferably, this arrangement in the tuner is essentially as disclosed and claimed in my copending application Serial No. 603,997, filed August 14, 1956, now Patent No. 2,878,378.

Figure 2:
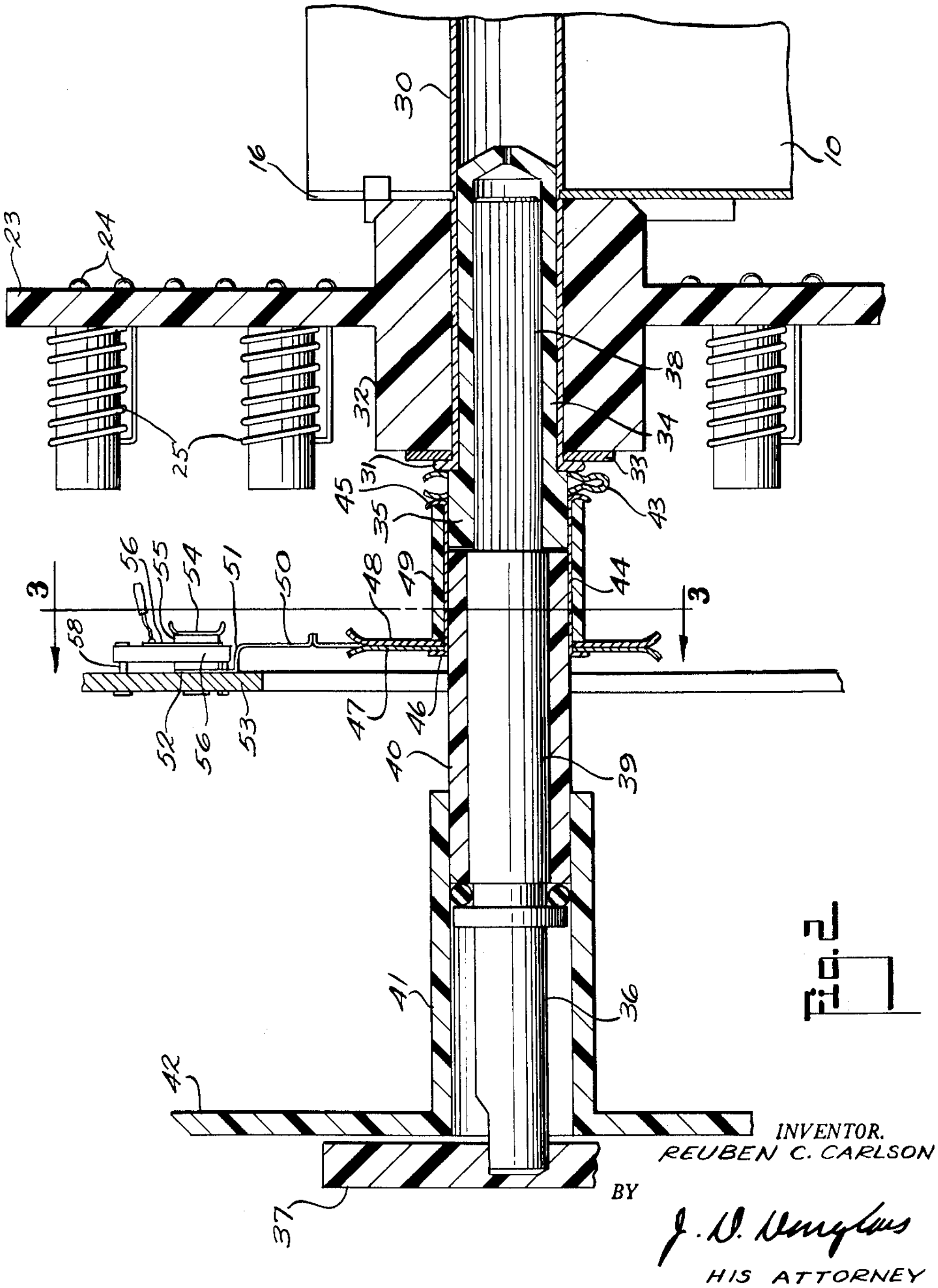
FIG. 2 is an enlarged vertical section through the tuning shaft arrangement in the tuner, taken along the line 2—2 in FIG. 1.

Referring to FIG. 2, the main tuning shaft assembly includes a cylindrical metal sleeve 30 which is rotatably mounted in both of the transverse walls 13 and 16 of the chassis and extends between them. At its inner end the sleeve 30 supports the first-mentioned tuner disc 19. The other tuner disc 23 also is rigidly mounted on the shaft sleeve 30, as shown in FIG. 2. At its outer end sleeve 30 is formed with a transverse flange 31. A flat annular metal washer 33 is engaged between this flange and the outer end of the hub 32 of insulation discs 23.

A hollow nylon sleeve 34 has a press fit in the outer end of metal sleeve 30. At its outer end, sleeve 34 has an enlarged transverse flange 35 which extends partially across the outer end of flange 31 on metal sleeve 30. If desired, the flange 35 may be in the form of a nylon collar separate from the sleeve 34. In FIG. 2 it is shown as being integral with sleeve 34.

A metal shaft member 36, which at its outer end is connected rigidly to the channel selector knob 37, has a reduced diameter knurled inner end 38 tightly received in the nylon sleeve 34. With this arrangement, when knob 37 is turned the shaft member 36, nylon sleeve 34 and metal sleeve 30 turn as a unit with it. The tuner discs 19 and 23 turn in unison with metal sleeve 30 to tune in the selected channel.

Just outward from its knurled inner end 38 the shaft member 36 has a larger diameter segment 39 on which is rotatably mounted an insulation sleeve 40 of Bakelite or other suitable material. The inner end of insulation sleeve 40 is spaced a very slight distance outward from the outer end of the outer flange 35 on nylon sleeve 34. At its outer end the sleeve 40 is tightly received in the inner end of the hollow stem 41 integral with the fine tuning knob 42. The fine tuning knob 42 is disposed just inward from the channel selector, or main tuning, knob 37 and is coaxial therewith. The knob 42 and its stem 41 are made out of suitable insulation material.

A resilient metal spring dual washer 43 encircles the inner end of the flange 35 and has one leg engaging the outer face of the outer end flange 31 on metal sleeve 30. An annular metal collar 44 tightly encircles the inner end of sleeve 40 and loosely encircles the outer end of flange 35. At its inner end the collar 44 has a rounded transverse flange 45 which engages the other leg of washer 43. At its outer end the collar 44 has a similar transverse flange 46 which engages the outermost one of a pair of contiguous annular flat metal discs 47 and 48, which tightly encircle collar 44. A short insulation spacer sleeve 49 encircles the collar 44 and is tightly positioned between the innermost disc 48 and the inner end flange 45 on the collar. The arrangement is such that the collar 44 rotates as a unit with sleeve 40 and is rotatable with respect to flange 35, and vice versa. The discs 47, 48 and spacer 49 turn in unison with collar 44. Accordingly, sleeve 40 turns with the fine tuning shaft 42, and when the latter is turned the discs 47 and 48 are turned correspondingly. The spring washer 43 and collar 44 provide a continuous electrically conductive path between the metal sleeve 30 and the discs 47 and 48.

The discs 47 and 48 operate a tunable condenser. Referring to FIGS. 2 and 3, the condenser preferably is essentially similar to that disclosed and claimed in my copending application Serial No. 597,785, filed July 13, 1956, now Patent No. 2,926,291. Briefly, this condenser arrangement comprises a metal follower 50 having an arcuate peripheral edge frictionally engaged between the discs 47 and 48. The follower 50 terminates in an outwardly offset neck 51, which in turn is connected to a flat annular hub portion 52 which is in metal-to-metal contact with a transverse wall 53 of the metal chassis 10. Preferably, the follower 50, neck 51 and hub portion 52 are formed as an integral sheet metal stamping. With this arrangement the discs 47 and 48 are grounded to the chassis through the follower 50, neck 51 and hub portion 52. An adjustable condenser plate 54 is connected integrally to the hub portion 52 through a bent over neck 55 in spaced relation to the neck 51 which connects follower 50 to the hub portion 52. The adjustable condenser plate 54 is in spaced confronting relation to a fixed condenser plate 56 formed by a conductive foil layer bonded to an insulation support plate 57. The insulation plate 57 is mounted on the chassis wall 53 by means of metal rivets which extend through insulation spacers 58, which space the insulation plate a short distance inward from the inner face of the chassis wall 53.

In the operation of this condenser, which is described in greater detail in the previously mentioned application Serial No. 597,785, when the fine tuning knob 42 is turned the discs 47 and 48 turn with it, and by their frictional engagement with follower 50 they cause the adjustable condenser plate 54 to turn in the opposite direction. Thus, the adjustable condenser plate 54 may be positioned in the desired capacitative relationship with respect to the fixed condenser plate 56 to thereby effect the desired fine tuning adjustment.

In the operation of the present tuning shaft arrangement, the shaft member 36, which is connected to the channel selector knob 37, is completely insulated and shielded from the chassis and the oscillator on the chassis. The metal sleeve 30, which forms part of the main tuning shaft assembly, at its inner end is in metal-to-metal contact with the chassis. The outer end of this sleeve 30, which extends outward beyond the transverse chassis wall 16 cannot act as an antenna because its outer end is grounded to the chassis wall 53 through the spring washer 43, collar 44, discs 47 and 48, follower 50, neck 51 and hub portion 52. Therefore, the problem of radiation from the tuning shaft itself is overcome. At the same time, the shaft assembly is of simple and economical construction which may be made on a mass production basis.

Accordingly, therefore, it will be apparent that the illustrated embodiment is particularly well suited for the accomplishment of the purposes to which the present invention is directed.

It is to be understood that, while there has been described in detail herein and illustrated in the accompanying drawings a particular presently preferred embodiment of the present invention, various modifications, omissions and refinements which depart from the disclosed embodiment may be adopted without departing from the spirit and scope of this invention.

I claim:

1. In a television tuner, the combination of a metal chassis supporting an oscillator and having a first transverse wall and a second transverse wall spaced outward from said first transverse wall, and a tuning shaft assembly comprising a first hollow metal shaft member rotatably mounted on the chassis in metal-to-metal contact with said first transverse wall and extending outward beyond said first transverse wall and terminating at its outer end inward from said second transverse wall, an insulation sleeve disposed inward from said second transverse wall and tightly received in the outer end of said first shaft member, a second metal shaft member having its inner end tightly received in said sleeve and its outer end disposed outward from said second transverse wall, a tuning knob mounted on the outer end of said second shaft member, insulation means surrounding said second shaft member throughout substantially its entire extent between said sleeve and its outer end, and means, including means mounted on the outside of said sleeve and said insulation means, providing an electrically conductive path between the outer end of said first shaft member and said second transverse wall of the chassis.

2. In a television tuner, the combination of a metal chassis supporting an oscillator and having a first transverse wall and a second transverse wall spaced outward from said first transverse wall, and a tuning shaft assembly comprising a first hollow metal shaft member rotatably mounted on the chassis in metal-to-metal contact with said first transverse wall and extending outward beyond said first transverse wall and the terminating at its outer end inward from said second transverse wall, a first hollow insulation sleeve tightly received in the outer end of said first shaft member, an enlarged flange at the outer end of said sleeve disposed between the outer end of said first shaft member and said second transverse wall, a second metal shaft member having its inner end tightly received in said sleeve and said flange and having its outer end disposed outward from said second transverse wall of the chassis, a first tuning knob mounted on the outer end of said second shaft member, a second hollow insulation sleeve rotatably mounted coaxially on said second shaft member and extending from the outer end of said flange outward beyond said second transverse wall, a second tuning knob connected to the outer end of said second sleeve and disposed in coaxial relation with said first tuning knob, a metal spring clip mounted on the outside of said flange and engaging the outer end of said first shaft member, a tubular metal member tightly mounted on the inner end of said second sleeve and having its inner end loosely encircling said flange and engaging said spring clip, a pair of contiguous metal discs mounted on said tubular member to turn therewith and in metal-to-metal contact therewith, a metal follower rotatably mounted on said second transverse wall of the chassis in metal-to-metal contact therewith and engaged frictionally between said discs to be turned in response to the turning of said discs, and adjustable tuning means coupled to said follower to be turned in response to the turning of said follower.

3. The combination of claim 2, wherein said second tuning knob and second insulation sleeve surround said second shaft member throughout substantially its entire extent between said flange and the first tuning knob.

4. In a television tuner having a chassis supporting an oscillator and including a metallic front panel: a metallic tuning shaft extending through said front panel, a tuning sleeve of insulating material concentric with said shaft and rotatable with respect to said shaft and said chassis and extending through said front panel, a first metallic sleeve encircling the inner end of said shaft and terminating inwardly of said front panel, insulating means securing said metallic sleeve to said shaft for rotation therewith, a second metallic sleeve encircling and connected to and rotatable with said tuning sleeve, said second metallic sleeve extending between and making electrical contact with and being rotatable with respect to said front panel and said first metallic sleeve, whereby said first and second metallic sleeves form a continuous radiation shield for the portion of said tuning shaft extending inwardly of said front panel.

5. In a television tuner having a chassis supporting an oscillator and including a metallic front panel, a metallic tuning shaft extending through said front panel, and a tuning sleeve concentric with said shaft and rotatable with respect to said shaft and said chassis and extending through said front panel: a first metallic sleeve encircling the inner end of said shaft and terminating inwardly of said front panel, insulating means securing said metallic sleeve to said shaft for rotation therewith, a second metallic sleeve encircling and rotatable with said tuning sleeve, said second metallic sleeve extending between and making electrical contact with and being rotatable with respect to said front panel and said first metallic sleeve, whereby said first and second metallic sleeves form a continuous radiation shield for the portion of said tuning shaft extending inwardly of said front panel.

6. In a television tuner having a chassis supporting an oscillator and including a metallic front panel, a metallic tuning shaft extending through said front panel, and a tuning sleeve of insulating material concentric with said shaft and rotatable with respect to said shaft and said chassis and extending through said front panel: a first metallic sleeve encircling the inner end of said shaft and terminating inwardly of said front panel, insulating means securing said metallic sleeve to said shaft for rotation therewith, a second metallic sleeve encircling and connected to and rotatable with said tuning sleeve, said second metallic sleeve extending between and making electrical contact with and being rotatable with respect to said front panel and said first metallic sleeve, whereby said first and second metallic sleeves form a continuous radiation shield for the portion of said tuning shaft extending inwardly of said front panel.

7. In a television tuner having a chassis supporting an oscillator and including a metallic front panel, a metallic tuning shaft extending through said front panel, and a tuning sleeve of insulating material concentric with said shaft and rotatable with respect to said shaft and said chassis and extending through said front panel: a first metallic sleeve encircling the inner end of said shaft and terminating inwardly of said front panel, an insulating sleeve securing said metallic sleeve to said shaft for rotation therewith, a second metallic sleeve encircling and connected to and rotatable with said tuning sleeve, said second metallic sleeve extending between and making electrical contact with and being rotatable with respect to said front panel and said first metallic sleeve, whereby said first and second metallic sleeves form a continuous radiation shield for the portion of said tuning shaft extending inwardly of said front panel, one of said metallic sleeves extending over and being rotatable with respect to the insulating sleeve associated with the other of said metallic sleeves.

References Cited in the file of this patent

UNITED STATES PATENTS

| | | |
|---|---|---|
| 2,261,879 | Higgins | Nov. 4, 1941 |
| 2,422,454 | Weiss | June 17, 1947 |
| 2,604,583 | Torre | July 22, 1952 |
| 2,795,693 | Fisher | June 11, 1957 |

FOREIGN PATENTS

| | | |
|---|---|---|
| 595,895 | Great Britain | Dec. 19, 1947 |
| 763,918 | Great Britain | Dec. 19, 1956 |
| 778,993 | France | Jan. 5, 1935 |
| 1,041,586 | France | Oct. 26, 1953 |